(12) United States Patent
Park

(10) Patent No.: US 11,631,651 B2
(45) Date of Patent: Apr. 18, 2023

(54) SEMICONDUCTOR PACKAGES INCLUDING AN ANCHOR STRUCTURE

(71) Applicant: SK hynix Inc., Icheon-si (KR)

(72) Inventor: Min Soo Park, Icheon-si (KR)

(73) Assignee: SK hynix Inc., Icheon-si (KR)

(\*) Notice: Subject to any disclaimer, the term of this patent is extended or adjusted under 35 U.S.C. 154(b) by 150 days.

(21) Appl. No.: 16/539,534

(22) Filed: Aug. 13, 2019

(65) Prior Publication Data

US 2020/0251437 A1 Aug. 6, 2020

(30) Foreign Application Priority Data

Jan. 31, 2019 (KR) .......................... 10-2019-0013107

(51) Int. Cl.
*H01L 23/00* (2006.01)
*H01L 23/498* (2006.01)

(52) U.S. Cl.
CPC ........ *H01L 24/17* (2013.01); *H01L 23/49811* (2013.01); *H01L 2224/1403* (2013.01); *H01L 2224/16227* (2013.01); *H01L 2224/17517* (2013.01)

(58) Field of Classification Search
CPC ........... H01L 2224/73204; H01L 24/81; H01L 24/13; H01L 2224/48227; H01L 24/16; H01L 2224/81141; H01L 2224/81193; H01L 24/14; H01L 2224/1403; H01L 24/17; H01L 23/49811; H01L 2224/16227; H01L 2224/17517
USPC ......... 257/737, 738, 777, E23.023; 438/613, 438/615
See application file for complete search history.

(56) References Cited

U.S. PATENT DOCUMENTS

| | | | |
|---|---|---|---|
| 5,405,809 A * | 4/1995 | Nakamura | H01L 21/563 257/E21.503 |
| 8,686,560 B2 | 4/2014 | Parvarandeh et al. | |
| 2004/0209453 A1* | 10/2004 | Akamatsu | H01L 24/81 438/613 |
| 2004/0232562 A1* | 11/2004 | Hortaleza | H05K 1/111 257/737 |
| 2012/0032321 A1* | 2/2012 | West | H01L 21/02697 257/737 |
| 2013/0026620 A1* | 1/2013 | Huang | H01L 24/81 257/737 |
| 2013/0049206 A1* | 2/2013 | Ryan | H01L 24/06 257/773 |
| 2015/0049450 A1* | 2/2015 | Okamoto | H01L 24/81 361/779 |

(Continued)

FOREIGN PATENT DOCUMENTS

KR 100719384 B1 5/2007

*Primary Examiner* — David Chen
(74) *Attorney, Agent, or Firm* — William Park & Associates Ltd.

(57) ABSTRACT

A semiconductor package includes a package substrate and a semiconductor chip mounted on the package substrate. The package substrate includes a signal bump land and an anchoring bump land, and the semiconductor chip includes a signal bump and an anchoring bump. The signal bump is bonded to the signal bump land, the anchoring bump is disposed to be adjacent to the anchoring bump land, and a bottom surface of the anchoring bump is located at a level which is lower than a top surface of the anchoring bump land with respect to a surface of the package substrate.

24 Claims, 11 Drawing Sheets

(56) References Cited

U.S. PATENT DOCUMENTS

2015/0187681 A1\* 7/2015 Mahajan ............ H01L 23/49811
  257/669
2016/0358892 A1\* 12/2016 Lee ......................... H01L 24/81

\* cited by examiner

SEMICONDUCTOR PACKAGES INCLUDING AN ANCHOR STRUCTURE

CROSS-REFERENCE TO RELATED APPLICATIONS

The present application claims priority under 35 U.S.C 119(a) to Korean Application No. 10-2019-0013107, filed on Jan. 31, 2019, which is incorporated herein by references in its entirety.

BACKGROUND

1. Technical Field

The present disclosure generally relates to semiconductor packages and, more particularly, to semiconductor packages including an anchor structure.

2. Related Art

In general, each of semiconductor packages may be configured to include a printed circuit board (PCB) and a chip mounted on the PCB. The chip may be electrically connected to the PCB through connection members such as bumps or wires.

In the event that the bumps are employed in the semiconductor packages as the connection members, the bumps may be formed on the chip and bump lands may be formed on the PCB. The bumps and the bump lands may then be bonded to each other using a solder material. Recently, the number of the connection members employed in each semiconductor package has increased to provide high performance semiconductor packages. Accordingly, a lot of effort has been focused on developing and guaranteeing a technique for bonding the bumps to the bump lands.

SUMMARY

According to an embodiment, a semiconductor package may include a package substrate and a semiconductor chip mounted on the package substrate. The package substrate may include a signal bump land and an anchoring bump land, and the semiconductor chip includes a signal bump and an anchoring bump. The signal bump is bonded to the signal bump land, the anchoring bump is disposed to be adjacent to the anchoring bump land, and a bottom surface of the anchoring bump may be located at a level which is lower than a top surface of the anchoring bump land with respect to a surface of the package substrate.

According to another embodiment, a semiconductor package may include a package substrate and a semiconductor chip mounted on the package substrate. The package substrate may be configured to include a surface extending in a major axis direction and a minor axis direction and configured to include a signal bump land and an anchoring bump land disposed on the surface. The semiconductor chip may include a signal bump adjacent the signal bump land and an anchoring bump adjacent the anchoring bump land. The anchoring bump land may be disposed on a corner region of the surface, and the anchoring bump is disposed to be closer to an edge region of the surface than the anchoring bump land in the major axis direction.

DETAILED DESCRIPTION

Figure 1:
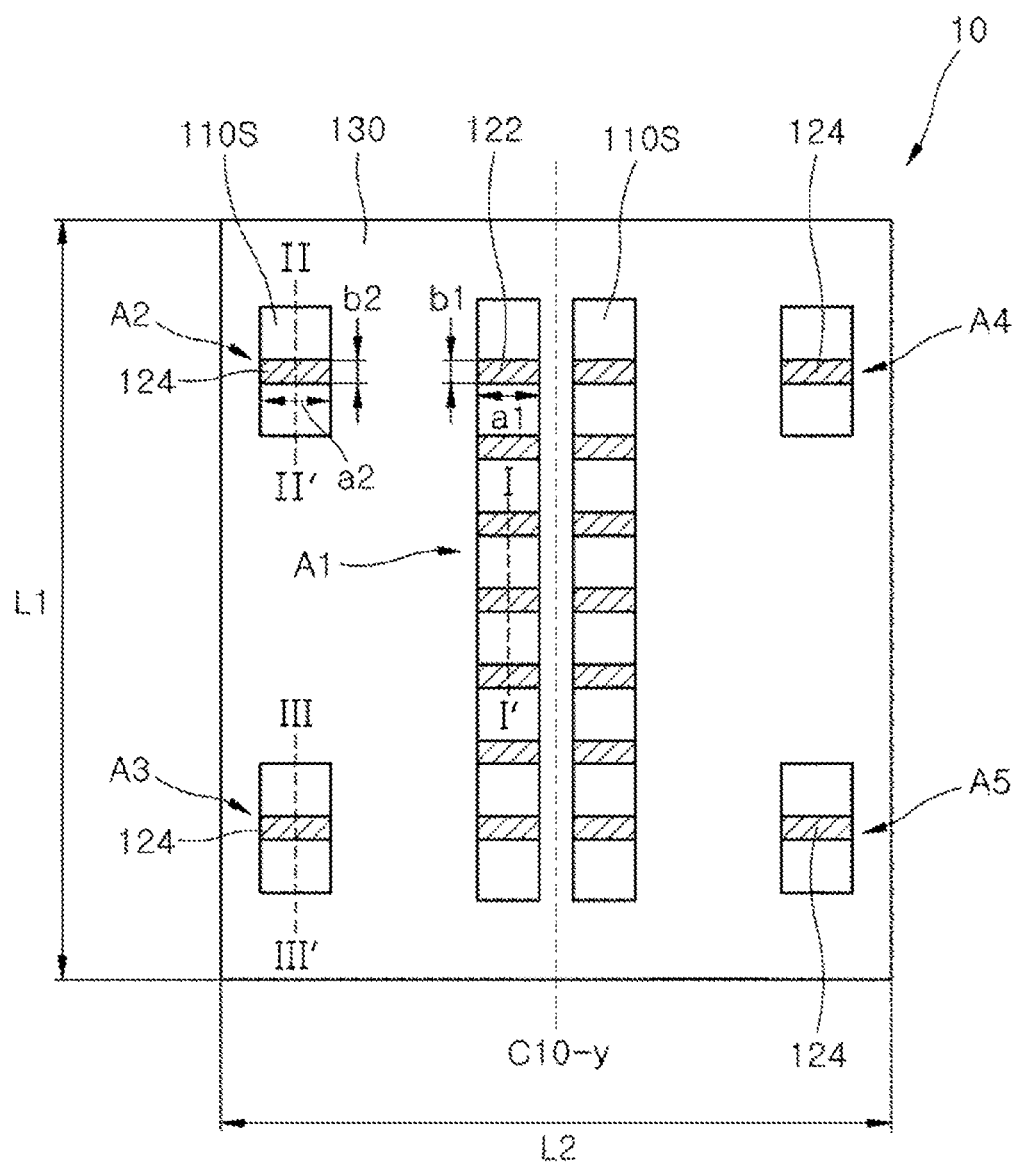
FIG. 1 is a plan view illustrating a package substrate of a semiconductor package according to an embodiment of the present disclosure.
Figure 1:
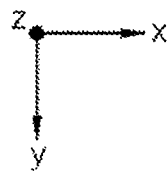

The terms used herein may correspond to words selected in consideration of their functions in the embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong.

It will be understood that although the terms "first," "second," "third" etc. may be used herein to describe various elements, these elements should not be limited by these terms. These terms are only used to distinguish one element from another element, but not used to define only the element itself or to mean a particular sequence.

It will also be understood that when an element or layer is referred to as being "on," "over," "below," "under," or "outside" another element or layer, the element or layer may be in direct contact with the other element or layer, or intervening elements or layers may be present. Other words used to describe the relationship between elements or layers should be interpreted in a like fashion (e.g., "between" versus "directly between" or "adjacent" versus "directly adjacent").

Spatially relative terms, such as "beneath," "below," "lower," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented above the other elements or features. The device may be otherwise oriented (rotated 90 degrees or at other orientations) and the spatially relative descriptors used herein interpreted accordingly.

A semiconductor package may include electronic devices such as semiconductor chips. The semiconductor package may include one or more anchor structures. The semiconductor chips may be obtained by separating a semiconductor substrate such as a wafer into a plurality of pieces using a die sawing process. The semiconductor chips may correspond to memory chips, logic chips (including application specific integrated circuits (ASIC) chips), or system-on-chips (SoC). The memory chips may include dynamic random access memory (DRAM) circuits, static random access memory (SRAM) circuits, NAND-type flash memory circuits, NOR-type flash memory circuits, magnetic random access memory (MRAM) circuits, resistive random access memory (ReRAM) circuits, ferroelectric random access memory (FeRAM) circuits or phase change random access memory (PcRAM) circuits which are integrated on the semiconductor substrate. The logic chips may include logic circuits which are integrated on the semiconductor substrate. The semiconductor chips may be referred to as semiconductor dies according to their shape after the die sawing process.

The semiconductor package may include a printed circuit board (PCB) on which the semiconductor chip is mounted. The PCB may include at least one layer of integrated circuit patterns and may be referred as a package substrate in the present specification. The package substrate may include a connection means for communicating with the semiconductor chip. The connection means may be formed using a wire bonding technique or a flip chip bonding technique to bond the semiconductor chip to the package substrate.

The semiconductor package may be employed in various communication systems such as mobile phones, electronic systems associated with biotechnology or health care, or wearable electronic systems.

Same reference numerals refer to same elements throughout the specification. Even though a reference numeral is not mentioned or described with reference to a drawing, the reference numeral may be mentioned or described with reference to another drawing. In addition, even though a reference numeral is not shown in a drawing, it may be mentioned or described with reference to another drawing.

In the present specification, the term "bond" may be used to describe a state that an element is physically or chemically attached and fixed to another element by a material having an adhesive strength. As an example, that a signal bump is bonded to a signal bump land may mean that the signal bump and the signal bump land are attached to each other using a solder layer such that the signal bump is fixed to the signal bump land.

In the present specification, the term "contact" or "be in contact with" may be used to describe a state that an element is in merely touch with another element. As an example, that an anchoring bump contacts an anchoring bump land may mean that the anchoring bump and the anchoring bump land are in merely touch with each other without using an adhesive material such as a solder layer. Thus, two elements contacting each other may be more easily separated or detached to each other as compared with two elements bonded to each other. The term "easily" may mean that a state (e.g., a contact state or a bond state) between two elements is changed into another state by a relatively low energy.

Figure 2:
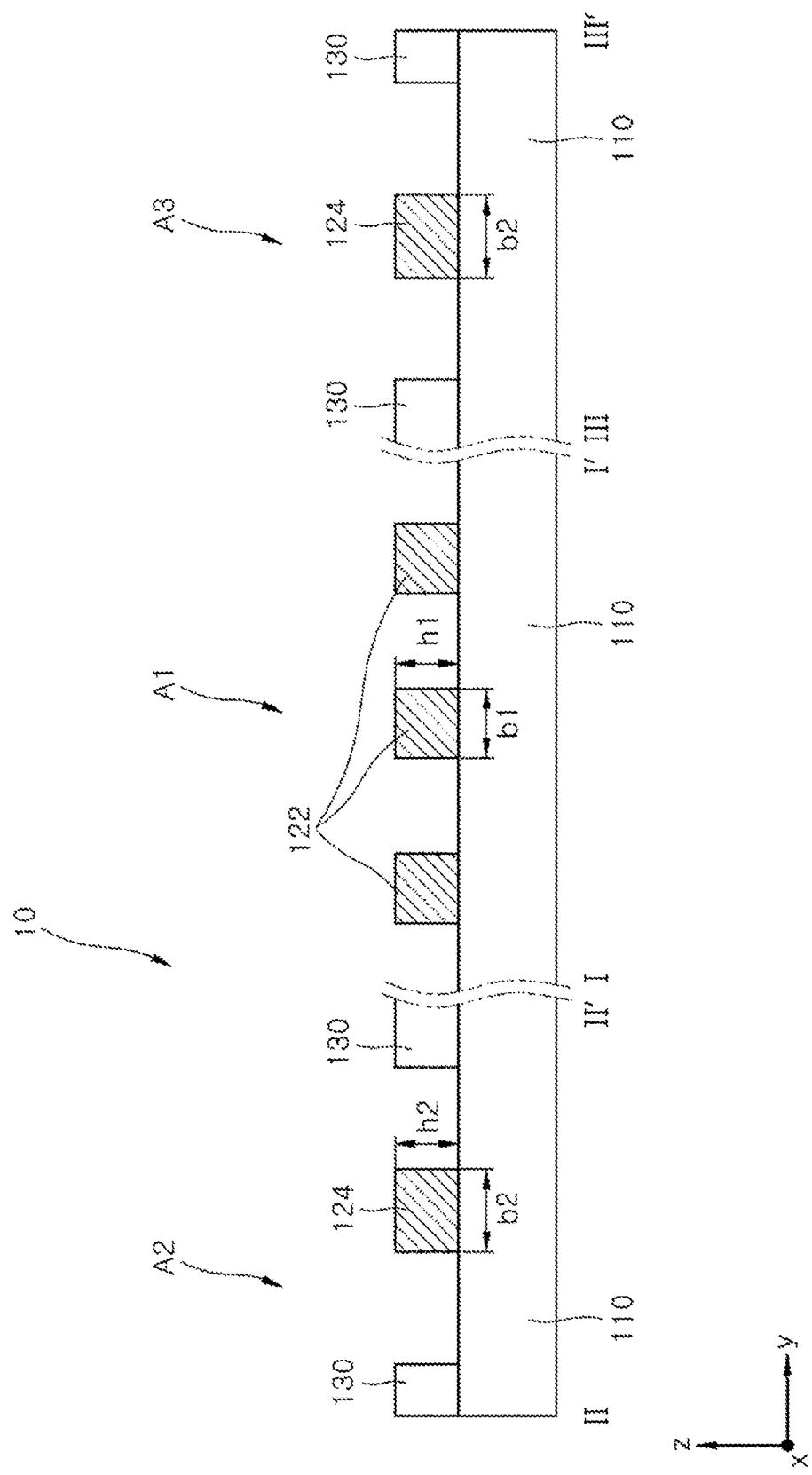
FIG. 2 is a cross-sectional view taken along lines I-I', II-II' and III-III' of FIG. 1.

FIG. 1 is a plan view illustrating a package substrate 10 of a semiconductor package according to an embodiment of the present disclosure. FIG. 2 is a cross-sectional view taken along lines I-I', II-II' and III-III' of FIG. 1.

Referring to FIGS. 1 and 2, the package substrate 10 may include a substrate body 110, signal bump lands 122 disposed on the package substrate 10, and anchoring bump lands 124 disposed on the package substrate 10. In addition, the package substrate 10 may further include a solder resist layer 130 that is disposed on the package substrate 10 to selectively expose the signal bump lands 122 and the anchoring bump lands 124. The package substrate 10 may be, for example, a printed circuit board (PCB), an interposer or a flexible PCB.

In an embodiment, the substrate body 110 may have a surface 110S extending in a direction parallel with a major axis (i.e., a y-axis) and a direction parallel with a minor axis (i.e., an x-axis). The substrate body 110 may have a first length L1 in the major axis direction and a second length L2 in the minor axis direction. Moreover, the substrate body 110 may have a central axis C10-$y$ parallel with the major axis direction and may have a rectangular planar shape which is symmetric with respect to the central axis C10-$y$. The substrate body 110 may act as an interconnection structure that electrically and signally connects the semiconductor chip (20 of FIG. 3) to an external device. Thus, although not shown in FIGS. 1 and 2, multiple layers of circuit patterns and an insulation layer for electrically insulating the multiple layers of circuit patterns from each other may be disposed in the substrate body 110. The multiple layers of circuit patterns and the insulation layer may be disposed to have various shapes. In addition, although not shown in FIGS. 1 and 2, a connection structure may be disposed on a bottom surface of the substrate body 110 opposite to the solder resist layer 130 to electrically connect the package substrate 10 to an external device. The connection structure may include solder balls or solder bumps. The connection structure may be electrically connected to the signal bump lands 122 through the multiple layers of circuit patterns disposed in the substrate body 110.

The signal bump lands 122 and the anchoring bump lands 124 may be disposed on the surface 110S of the substrate body 110. One of the signal bump lands 122 may be electrically connected to at least one of the multiple layers of circuit patterns. The signal bump lands 122 may be formed of a conductive material. For example, the signal bump lands 122 may include a copper material. The anchoring bump lands 124 may be dummy lands that are electrically insulated from the circuit patterns through which signals are transmitted. The anchoring bump lands 124 may be rigid enough to apply a force to anchoring bumps (224 of FIG. 9) when the package substrate 10 thermally expands (see FIG. 9). In an embodiment, the anchoring bump lands 124 may be formed to include a metal material such as a copper material.

Referring to FIG. 1, the signal bump lands 122 may be arrayed in a direction parallel with the major axis on a region A1 of the surface 110S. The signal bump lands 122 may be arrayed in at least two columns. The signal bump lands 122 may be arrayed to be symmetric with respect to the central axis C10-$y$. Each of the signal bump lands 122 may have a width "a1" in a direction parallel with the minor axis and may have a length "b1" in a direction parallel with the major axis. In an embodiment, the width "a1" in the minor axis direction may be greater than the length "b1" in the major axis direction. For example, each of the signal bump lands 122 may be disposed to have a belt shape or a band shape extending in the minor axis direction.

Figure 3:
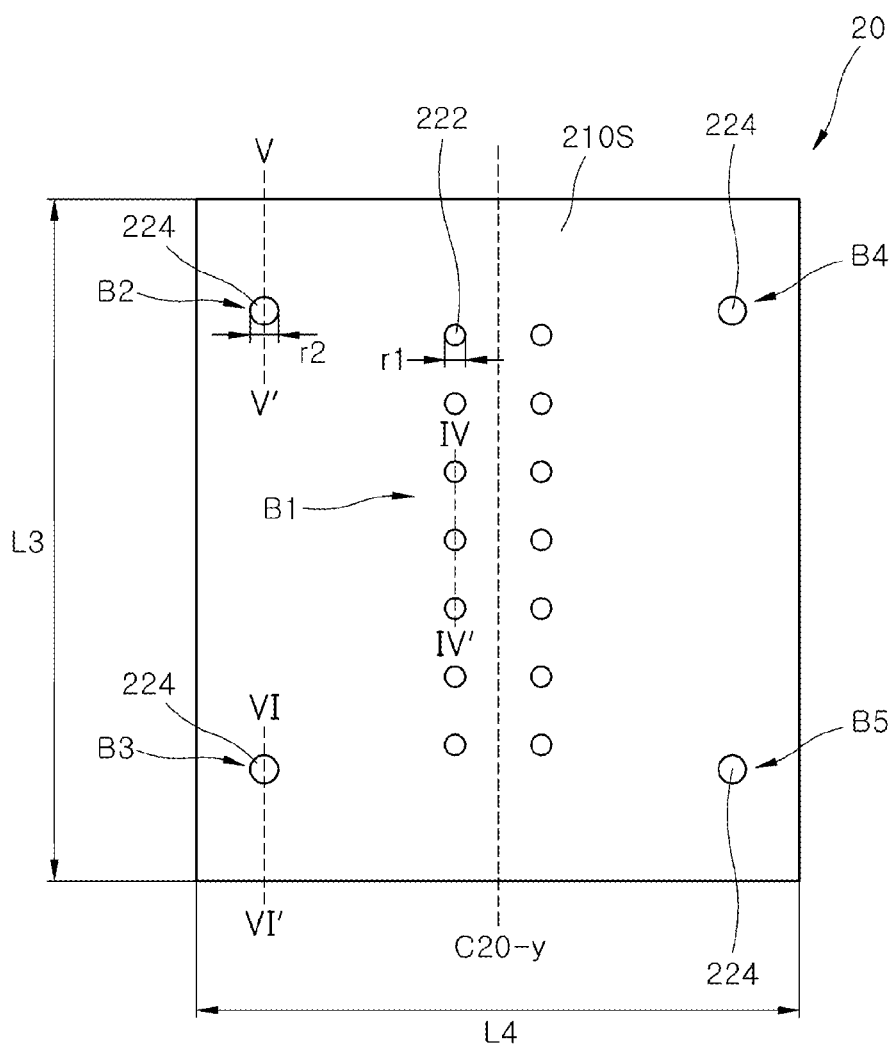
FIG. 3 is a plan view illustrating a semiconductor chip of a semiconductor package according to an embodiment of the present disclosure.

As can be seen from the description of FIG. 3, the width "a1" of the signal bump lands 122 may be greater than a diameter "r1" of signal bumps 222. Referring to FIG. 2, the signal bump lands 122 may have a height "h1" in a direction parallel with a z-axis corresponding to a normal of the surface 110S.

The anchoring bump lands 124 may be disposed in corner regions A2, A3, A4 and A5 of the surface 110S, respectively. Thus, the anchoring bump lands 124 may be disposed on edge regions of the surface 110S of the substrate body 110 to be farther than the signal bump lands 122 from the central axis C10-*y*. The anchoring bump lands 124 may be disposed to be symmetric with respect to the central axis C10-*y*. Each of the anchoring bump lands 124 may have a width "a2" in the minor axis direction and may have a length "b2" in the major axis direction. In an embodiment, the width "a2" in the minor axis direction may be greater than the length "b2" in the major axis direction. For example, each of the anchoring bump lands 124 may be disposed to have a belt shape or a band shape extending in the minor axis direction. Referring to FIG. 2, the anchoring bump lands 124 may have a height "h2" in a direction parallel with the z-axis corresponding to a normal of the surface 110S.

As can be seen from the description of FIG. 3, the width "a2" of the anchoring bump lands 124 may be greater than a diameter "r2" of the anchoring bumps 224. Thus, even though a misalignment between the anchoring bump lands 124 and the anchoring bumps 224 occurs within a predetermined range, the probability that the anchoring bump lands 124 are disposed to be in contact with side surfaces of the anchoring bumps 224 may increase, as can be seen from the description of FIGS. 5 and 6. As a result, when a semiconductor package 30 illustrated in FIGS. 7 to 10 is fabricated, the anchoring bump lands 124 may sufficiently apply a force to the anchoring bumps 224. The word "predetermined" as used herein with respect to a parameter, such as a predetermined range, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

In an embodiment, the width "a2", the length "b2" and the height "h2" of the anchoring bump lands 124 may be substantially equal to the width "a1", the length "b1" and the height "h1" of the signal bump lands 122, respectively. In another embodiment, at least one of the width "a2", the length "b2" and the height "h2" of the anchoring bump lands 124 may be different from the corresponding one of the width "a1", the length "b1" and the height "h1" of the signal bump lands 122.

Referring again to FIGS. 1 and 2, the solder resist layer 130 may be disposed on the surface 110S of the substrate body 110 to selectively expose the signal bump lands 122 and the anchoring bump lands 124. The solder resist layer 130 may be disposed to protect the substrate body 110. As illustrated in FIG. 1, the solder resist layer 130 may be disposed to expose the signal bump lands 122 through openings or slits parallel with the major axis direction on the region A1 of the surface 110S. In addition, the solder resist layer 130 may be disposed to expose the anchoring bump lands 124 on the corner regions A2, A3, A4 and A5 of the surface 110S.

Figure 4:
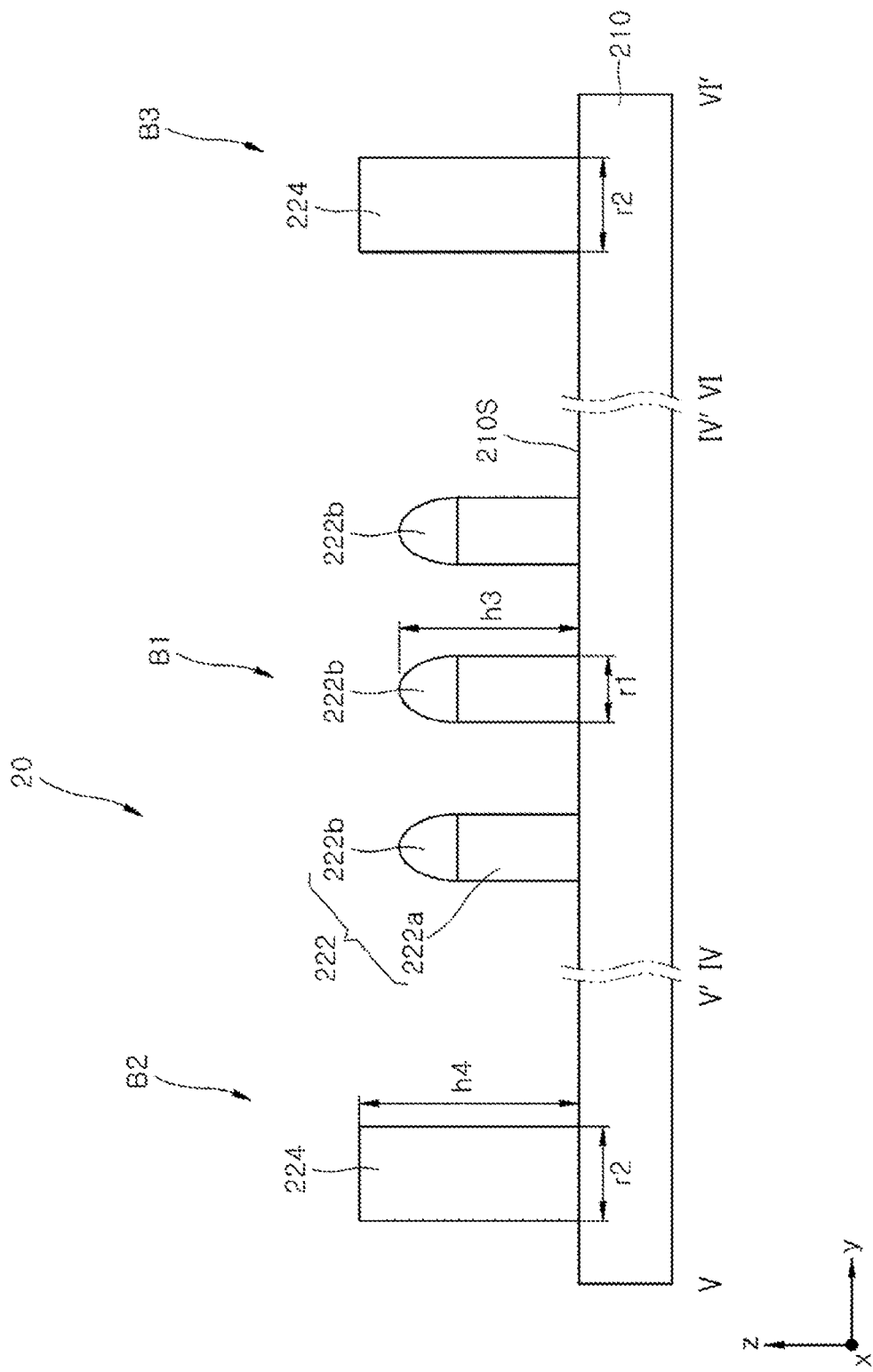
FIG. 4 is a cross-sectional view taken along lines IV-IV', V-V' and VI-VI' of FIG. 3.

FIG. 3 is a plan view illustrating a semiconductor chip 20 included in a semiconductor package according to an embodiment of the present disclosure. FIG. 4 is a cross-sectional view taken along lines IV-IV', V-V' and VI-VI' of FIG. 3.

Referring to FIGS. 3 and 4, the semiconductor chip 20 may include a chip body 210, the signal bumps 222 disposed on the chip body 210, and the anchoring bumps 224 disposed on the chip body 210.

In an embodiment, the chip body 210 may have a surface 210S extending in the major axis direction and the minor axis direction. The chip body 210 may have a first length L3 in the major axis direction and a second length L4 in the minor axis direction. Moreover, the chip body 210 may have a central axis C20-*y* parallel with the major axis direction and may have a rectangular planar shape which is symmetric with respect to the central axis C20-*y*.

Although not shown in FIGS. 3 and 4, multiple layers of circuit patterns and an insulation layer for electrically insulating the multiple layers of circuit patterns from each other may be disposed in the chip body 210. The multiple layers of circuit patterns and the insulation layer may be various circuit patterns constituting an electronic device.

The signal bumps 222 and the anchoring bumps 224 may be disposed on the surface 210S of the chip body 210. One of the signal bumps 222 may be electrically connected to at least one of the multiple layers of circuit patterns. The signal bumps 222 may be formed of a conductive material. Each of the signal bumps 222 may include a bump body 222*a* and a solder pattern 222*b*. In such a case, the bump body 222*a* may include a copper material. The anchoring bumps 224 may be dummy bumps that are electrically insulated from the circuit patterns through which signals are transmitted. The anchoring bumps 224 may be rigid enough to accept a force from the anchoring bump lands 124 and to fully apply the force to the chip body 210 such that the semiconductor chip 20 warps when the package substrate 10 thermally expands, as can be seen from the description of FIG. 9. In an embodiment, the anchoring bumps 224 may be formed to include a metal material such as a copper material.

Referring to FIG. 3, the signal bumps 222 may be arrayed in a direction parallel with the major axis on a region B1 of the surface 210S. The signal bumps 222 may be arrayed in at least two columns. The signal bumps 222 may be arrayed at locations corresponding to the signal bump lands 122 (see FIGS. 5 and 6).

Referring to FIG. 4, each of the signal bumps 222 may be include the bump body 222*a* disposed to protrude from the surface 210S of the chip body 210 and the solder pattern 222*b* disposed on an end the bump body 222*a* opposite to the chip body 210. For example, the bump bodies 222*a* may have a pillar shape or a post shape. In an embodiment, the bump bodies 222*a* may have a circular shape, an oval shape or a polygonal shape when viewed from a plan view. The solder patterns 222*b* may include a tin material, a silver material, a nickel material, or a combination containing at least two thereof. The solder patterns 222*b* may have a hemispherical shape. In an embodiment, the solder patterns 222*b* may be formed by plating the bump bodies 222*a* with a solder material having a fixed form or a non-fixed form and by heating the solder material to transform the solder material. As illustrated in FIG. 3, each of the signal bumps 222 may be disposed to have a circular shape with a first diameter "r1" in a plan view. As illustrated in FIG. 4, the signal bumps 222 may have a first height "h3" from the surface 210S of the chip body 210.

The anchoring bumps 224 may be disposed in corner regions B2, B3, B4 and B5 of the surface 210S, respectively. Thus, the anchoring bumps 224 may be disposed on edge regions of the surface 210S of the chip body 210 to be farther than the signal bumps 222 from the central axis C20-*y*. The anchoring bumps 224 may be disposed to be symmetric with respect to the central axis C20-y. In an embodiment, the anchoring bumps 224 may be disposed to protrude from the surface 210S of the chip body 210. Each of the anchoring bumps 224 may have a pillar shape or a post shape. In an embodiment, the anchoring bumps 224 may have a circular shape, an oval shape or a polygonal shape when viewed from a plan view. The anchoring bumps 224 may be disposed without any solder patterns.

As illustrated in FIG. 3, each of the anchoring bumps 224 may be disposed to have a circular shape with a second diameter "r2" in a plan view. As illustrated in FIG. 4, the anchoring bumps 224 may have a second height "h4" from the surface 210S of the chip body 210. In an embodiment, the second diameter "r2" of the anchoring bumps 224 may be greater than the first diameter "r1" of the signal bumps 222. The second height "h4" of the anchoring bumps 224 may be greater than the first height "h3" of the signal bumps 222. In some other embodiments, the second diameter "r2" of the anchoring bumps 224 may be equal to or less than the first diameter "r1" of the signal bumps 222. In some other embodiments, the anchoring bumps 224 may be pillars having an oval shape or a polygonal shape in a plan view. In such a case, a length of the anchoring bumps 224 in the major axis direction may be greater than a length of the signal bumps 222 in the major axis direction, and a length of the anchoring bumps 224 in the minor axis direction may be greater than a length of the signal bumps 222 in the minor axis direction.

Figure 5:
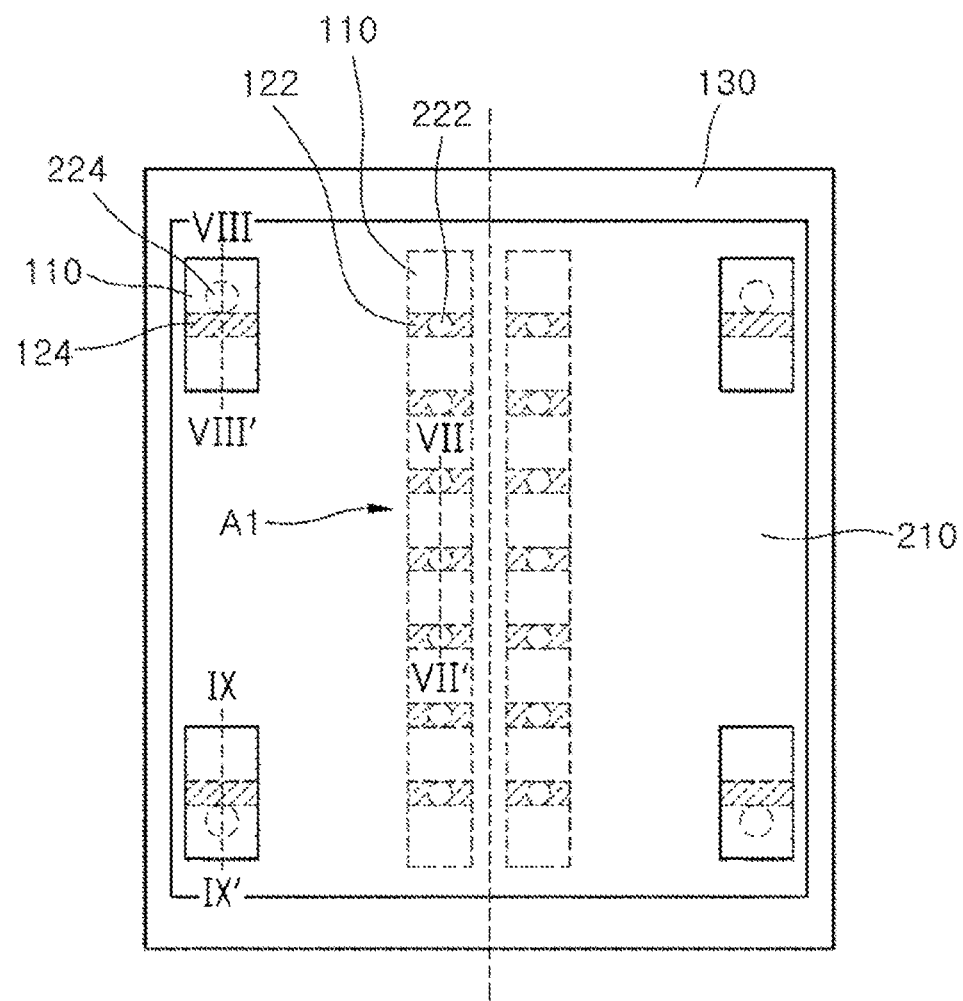
FIG. 5 is a plan view illustrating a semiconductor package according to an embodiment of the present disclosure.
Figure 6:
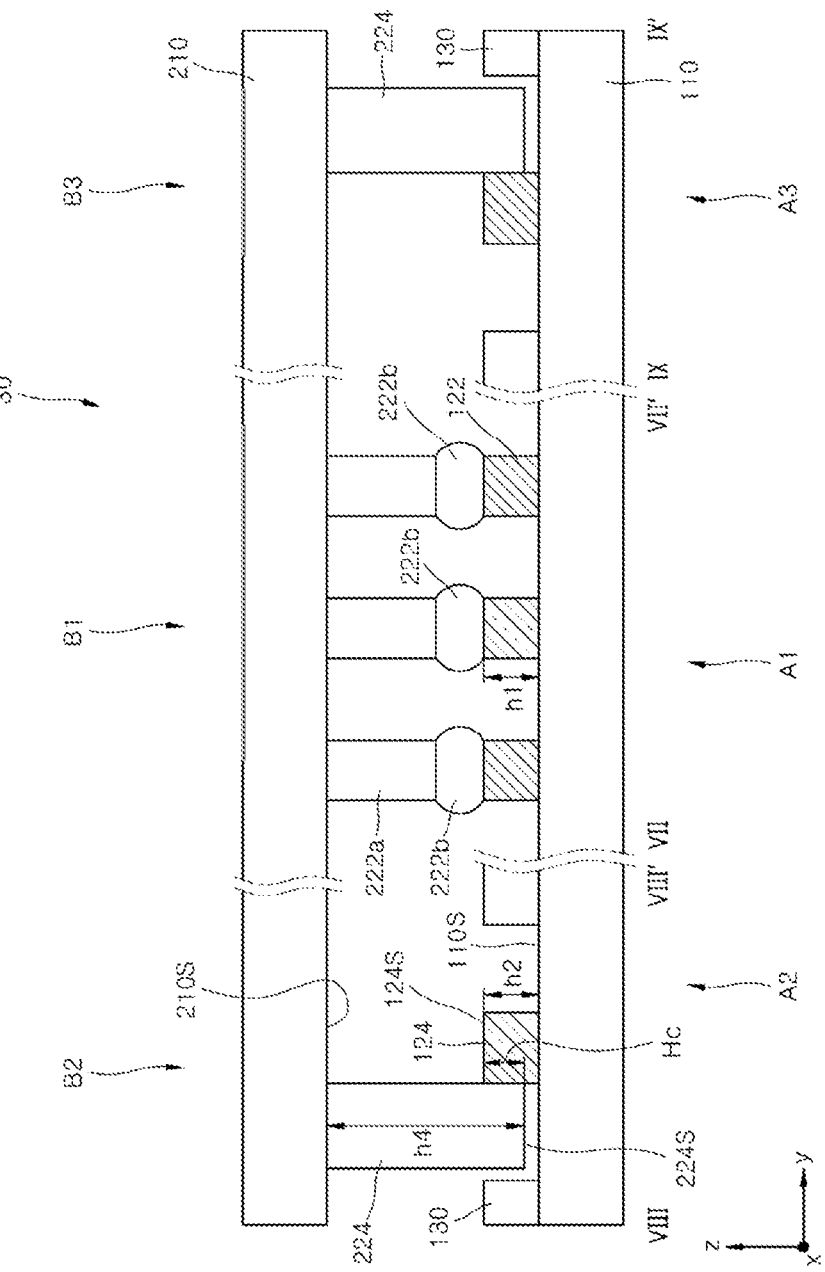
FIG. 6 is a cross-sectional view taken along lines VII-VII', VIII-VIII' and IX-IX' of FIG. 5.

FIG. 5 is a plan view illustrating a semiconductor package 30 according to an embodiment of the present disclosure. FIG. 6 is a cross-sectional view taken along lines VII-VII', VIII-VIII' and IX-IX' of FIG. 5. The semiconductor package 30 of FIG. 5 includes the package substrate 10 which is described with reference to FIGS. 1 and 2 and the semiconductor chip 20 which is described with reference to FIGS. 3 and 4 and mounted on the package substrate 10. FIG. 6 is a schematic cross-sectional view illustrating the semiconductor package 30 shown in FIG. 5. As illustrated in FIGS. 5 and 6, in the semiconductor package 30, the semiconductor chip 20 may be bonded to the package substrate 10 using a flip-chip bonding technique. The semiconductor package 30 illustrated in FIGS. 5 and 6 may be fabricated using a bonding process illustrated in FIGS. 7 to 10.

Referring to FIGS. 5 and 6, the signal bumps 222 may be bonded to the signal bump lands 122 by the solder patterns 222b. For example, the signal bumps 222 may at least partially overlap with respective ones of the signal bump lands 122 in the z-axis direction such that the signal bumps 222 are easily bonded to the signal bump lands 122 by the solder patterns 222b.

The anchoring bumps 224 may be disposed to be laterally adjacent to the anchoring bump lands 124. As illustrated in FIG. 5, the anchoring bumps 224 may be disposed to be closer to the edge regions of the surface 210S of the chip body 210 than the anchoring bump lands 124 in the major axis direction. In an embodiment, the anchoring bumps 224 may be disposed on the chip body 210 of the semiconductor chip 20 and the anchoring bumps 224 may be located closer to an edge region of the surface 110S of substrate body 110 of the package substrate 10. That is, the anchoring bumps 224 may be disposed between the anchoring bump lands 124 and side surfaces of the chip body 210 in the major axis direction when viewed from a plan view. In an embodiment, the anchoring bumps 224 may be disposed between the anchoring bump lands 124 and side surfaces of the substrate body 110 in the major axis direction when viewed from a plan view. The anchoring bumps 224 might not include a solder material. Thus, the anchoring bumps 224 might not be bonded to the anchoring bump lands 124. As a result, the anchoring bumps 224 might not be bonded to the anchoring bump lands 124 but merely be in contact or non-contact with the anchoring bump lands 124.

In an embodiment, the anchoring bumps 224 might not overlap with the anchoring bump lands 124 in a vertical direction (i.e., in the z-axis direction), as illustrated in FIG. 6. That is, the anchoring bumps 224 may be inserted into empty spaces between the solder resist layer 130 and the anchoring bump lands 124. The empty spaces in which the anchoring bumps 224 are disposed may be located on portions of the surface 110S, which are exposed by openings of the solder resist layer 130. As a result, the anchoring bumps 224 may be disposed to be laterally adjacent to the anchoring bump lands 124, and bottom surfaces 224S of the anchoring bumps 224 may be located at a level which is lower than top surfaces 124S of the anchoring bump lands 124 when the surface 110S of the substrate body 110 is regarded as a reference level. That is, the bottom surfaces 224S of the anchoring bumps 224 may be located to be closer to the surface 110S of the substrate body 110 than the top surfaces 124S of the anchoring bump lands 124. In an embodiment, the bottom surfaces 224S of the anchoring bumps 224 may be located at a level which is lower than top surfaces 124S of the anchoring bump lands 124 with respect to the surface 110S of the package substrate 10. The anchoring bumps 224 may be located to be laterally offset relative to the anchoring bump lands 124 in a plan view. In an embodiment, the bottom surfaces 224S of the anchoring bumps 224 may be located above the surface 110S of the substrate body 110 without contacting the surface 110S of the substrate body 110. However, in some other embodiments, at least one of the bottom surfaces 224S of the anchoring bumps 224 may be in contact with the surface 110S of the substrate body 110.

In an embodiment, a portion of a side surface of any one of the anchoring bumps 224 and a portion of a side surface of any one of the anchoring bump lands 124 may overlap with each other in a lateral direction (i.e., the y-axis direction) to provide an overlapping portion Hc. As illustrated in FIG. 6, although the side surfaces of the anchoring bumps 224 are in contact with respective ones of the side surfaces of the anchoring bump lands 124, the present disclosure is not limited thereto. For example, in some other embodiments, at least one of the side surfaces of the anchoring bumps 224 may be spaced apart from the corresponding one of the side surfaces of the anchoring bump lands 124. Even in a case that the side surfaces of the anchoring bumps 224 are spaced apart from the corresponding side surfaces of the anchoring bump lands 124, the anchoring bumps 224 may be located to be spaced apart from the anchoring bump lands 124 by a predetermined distance less than a certain distance because the anchoring bump lands 124 have to move and push the anchoring bumps 224 to apply a force to the anchoring bumps 224 when the package substrate 10 thermally expands (see FIGS. 7 to 10).

In order that the anchoring bump lands 124 sufficiently apply a force to the anchoring bumps 224 through the overlapping portions Hc of the anchoring bump lands 124, a side surface of each of the anchoring bumps 224 may be designed to cover or overlap with 40% to 70% of a height of a side surface of the corresponding anchoring bump land 124. For example, if the height "h2" of the anchoring bump lands 124 is 10 micrometers, the overlapping portions Hc may have a height of 4 micrometers to 7 micrometers.

As described above, according to an embodiment of the present disclosure, the signal bump lands 122 may maintain a state contacting the signal bumps 222. In contrast, the anchoring bump lands 124 of the package substrate 10 might not be bonded to the anchoring bumps 224 of the semiconductor chip 20. Accordingly, while each of the signal bumps 222 includes a solder pattern, the anchoring bumps 224 might not include any solder pattern. The anchoring bump lands 124 may be disposed to be laterally offset relative to the anchoring bumps 224 such that the top surfaces 124S of the anchoring bump lands 124 do not contact the bottom surfaces 224S of the anchoring bumps 224. The anchoring bumps 224 may be disposed to be closer to side surfaces of the substrate body 110 than the anchoring bump lands 124 in the major axis direction, and each of the anchoring bumps 224 may be disposed to cover or overlap at least a portion of the side surface of any one of the anchoring bump lands 124. Thus, the bonding reliability between the signal bumps 222 and the signal bump lands 122 may be improved when a solder bonding process is performed to bond the signal bumps 222 to the signal bump lands 122 (see FIGS. 7 to 10).

Figure 7:
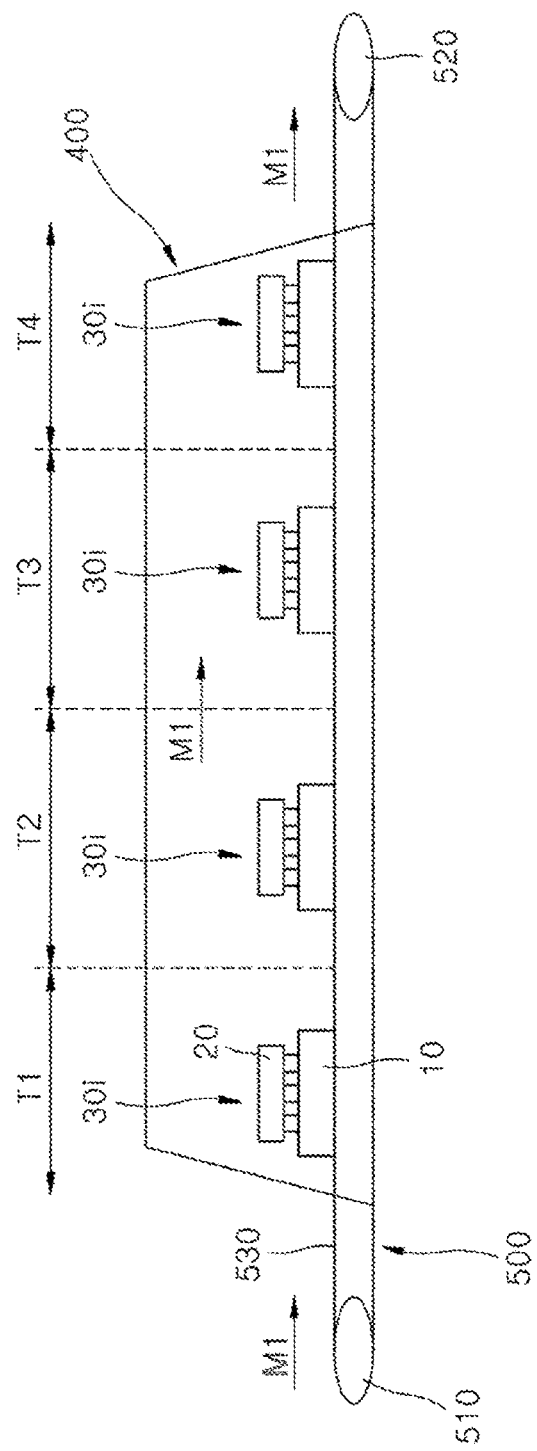
FIG. 7 is a schematic diagram illustrating a step of bonding a semiconductor chip to a package substrate in a fabrication process of a semiconductor package according to an embodiment of the present disclosure.
Figure 8:
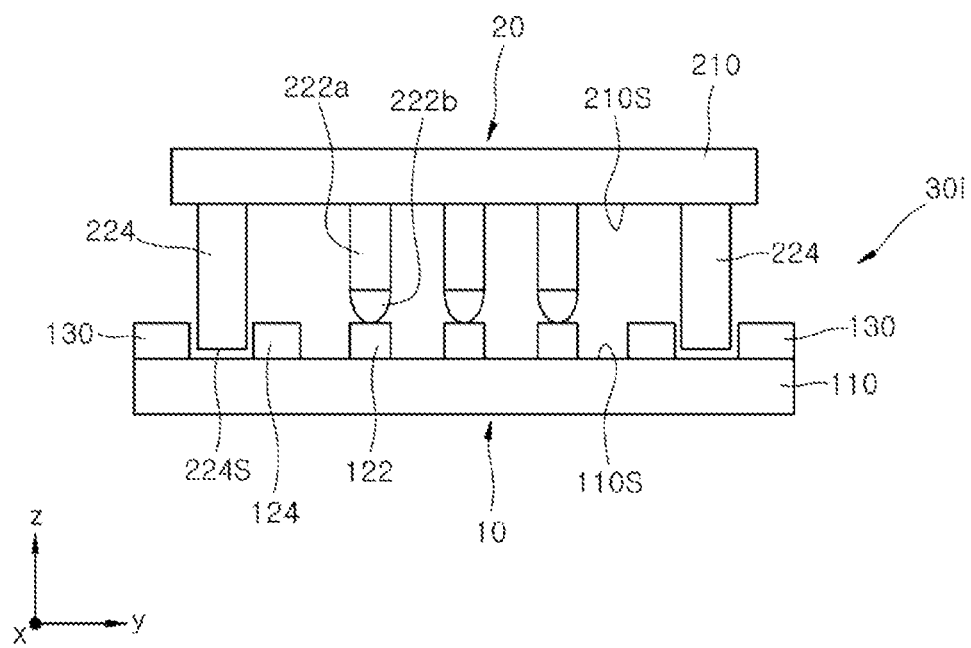
FIGS. 8 to 10 are cross-sectional views illustrating a bonding process of a package substrate and a semiconductor chip employed in a semiconductor package according to an embodiment of the present disclosure.
Figure 9:
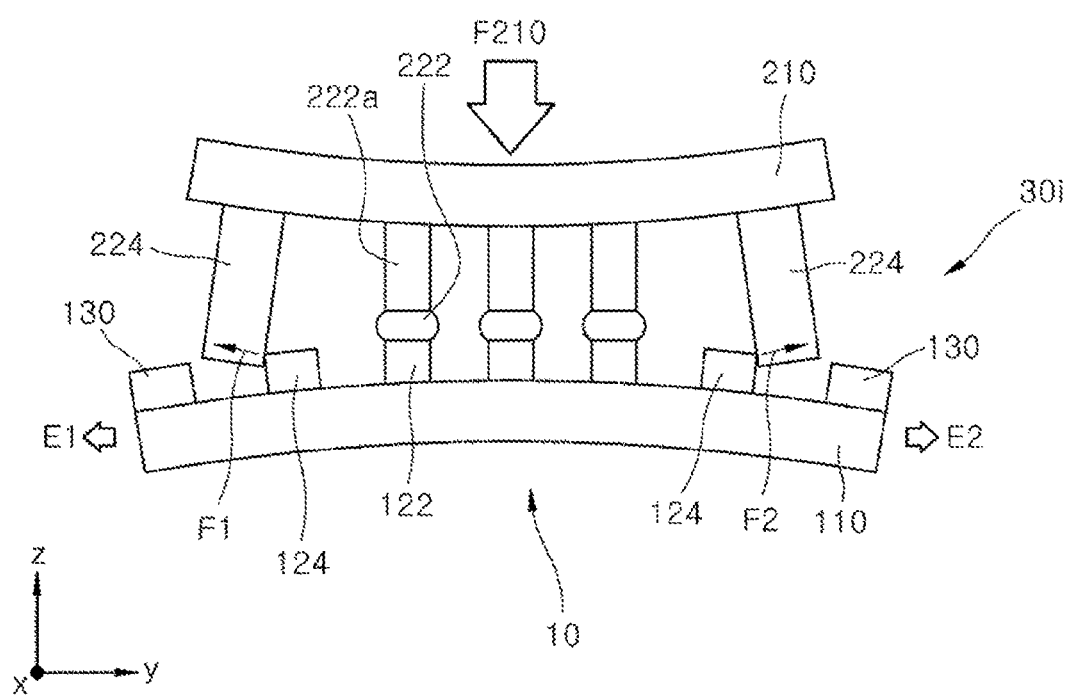
Figure 10:
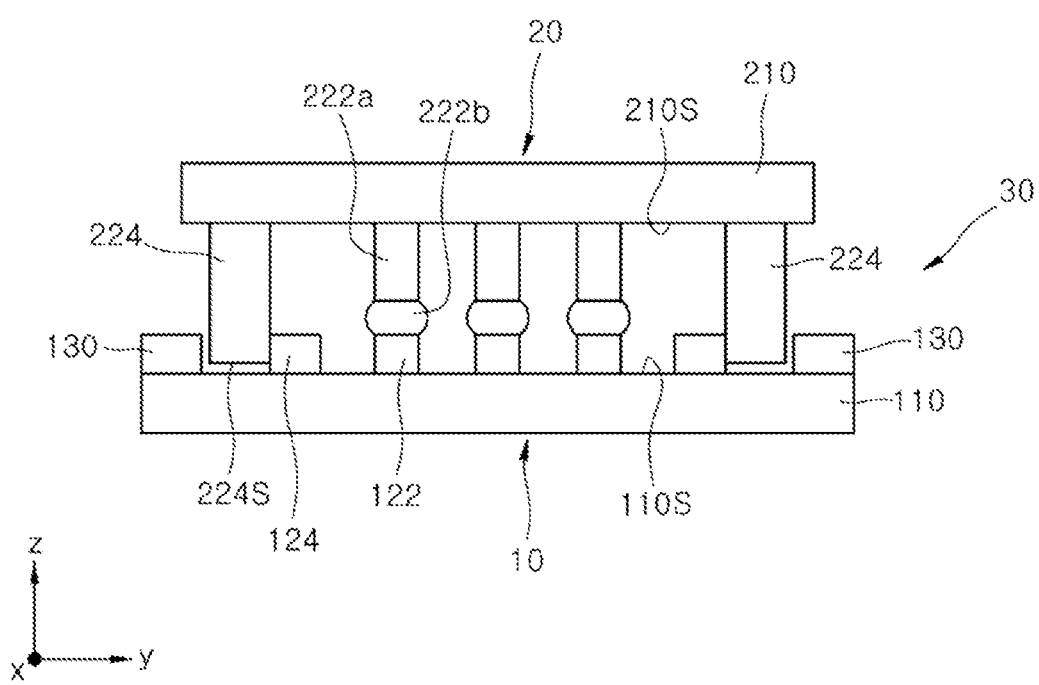

FIG. 7 is a schematic diagram illustrating a step of bonding the semiconductor chip 20 to the package substrate 10 in a fabrication process of the semiconductor package 30 according to an embodiment of the present disclosure. FIGS. 8 to 10 are cross-sectional views illustrating a bonding process of the package substrate 10 and the semiconductor chip 20 employed in the semiconductor package 30 according to an embodiment of the present disclosure. In FIGS. 8 to 10, for the purpose of ease and convenience in explanation, the signal bump lands 122 and the anchoring bump lands 124 are illustrated to be adjacent to each other on the surface 110S of the substrate body 110 and the signal bumps 222 and the anchoring bumps 224 are illustrated to be adjacent to each other on the surface 210S of the chip body 210.

Referring to FIG. 7, the bonding process of the package substrate 10 and the semiconductor chip 20 may be performed using a reflow chamber 400 and a transfer apparatus 500 in a reflow oven. The transfer apparatus 500 may drive a pair of drive axes 510 and 520 to move a transfer plate 530 in a direction M1. The bonding process may be carried out by driving the transfer apparatus 500 such that a stack structure 30*i* including the semiconductor chip 20 mounted on the package substrate 10 sequentially passes through first to fourth sections T1, T2, T3 and T4 separately divided in the reflow chamber 400.

Referring to FIG. 8, the package substrate 10 described with reference to FIGS. 1 and 2 and the semiconductor chip 20 described with reference to FIGS. 3 and 4 may be provided. For example, the semiconductor chip 20 in which the signal bumps 222 including the solder pattern 222*b* are formed may be provided. In an embodiment, the solder patterns 222*b* may be formed by plating the bump bodies 222*a* with a solder material having a fixed form or a non-fixed form and by heating the solder material to transform the solder material into a spherical shape. Subsequently, the semiconductor chip 20 may be stacked on the package substrate 10 such that the surface 210S of the semiconductor chip 20 faces the surface 110S of the package substrate 10, thereby providing the stack structure 30*i*. In the stack structure 30*i*, the signal bumps 222 may be disposed to vertically overlap with respective ones of the signal bump lands 122, and the anchoring bumps 224 may be disposed to be laterally offset relative to the anchoring bump lands 124 without vertically overlapping with anchoring bump lands 124. As illustrated in FIG. 8, the solder patterns 222*b* of the signal bumps 222 may be disposed to be in contact with the signal bump lands 122, respectively. The side surfaces of the anchoring bumps 224 may be located to at least partially overlap with the surfaces of the anchoring bump lands 124 in a lateral direction (i.e., the y-axis direction). In such a case, the semiconductor chip 20 may be stacked on the package substrate 10 such that the side surfaces of the anchoring bumps 224 are physically spaced apart from the surfaces of the anchoring bump lands 124 in the lateral direction (i.e., the y-axis direction), as illustrated in FIG. 8. Even in such a case, the anchoring bumps 224 may be located to be spaced apart from the anchoring bump lands 124 by a predetermined distance less than a certain distance in the lateral direction because the anchoring bump lands 124 have to move and push the anchoring bumps 224 to apply a force to the anchoring bumps 224 when the package substrate 10 thermally expands. In an embodiment, the bottom surfaces 224S of the anchoring bumps 224 may be spaced apart from the surface 110S of the substrate body 110.

Referring again to FIG. 7, after the stack structure 30*i* is loaded on the transfer plate 530 of the transfer apparatus 500, the stack structure 30*i* may move in the direction M1 to pass through the first section T1. In the first section T1, the stack structure 30*i* may be heated up for execution of a pre-heating step and a soaking step. For example, the stack structure 30*i* may be heated up from a room temperature to a high temperature of 150 degrees Celsius to 180 degrees Celsius in the first section T1.

Subsequently, the stack structure 30*i* may pass through the second section T2 of the reflow chamber 400. The second section T2 may be a first high temperature section, and the pre-heating step and the soaking step may be performed in the second section T2. For example, the stack structure 30*i* may maintain the temperature of 150 degrees Celsius to 180 degrees Celsius in the second section T2. While the stack structure 30*i* passes through the second section T2, volatile components in the solder patterns 222*b* may be removed. In addition, while the stack structure 30*i* passes through the second section T2, a flux of the solder patterns 222*b* may be activated to reduce the surfaces of the signal bump lands 122 to be bonded to the signal bumps 222 later. Moreover, in the second section T2, the stack structure 30*i* may be thermally stabilized at a temperature which is lower than a reflow temperature in advance of the third section T3.

Referring to FIGS. 7 and 9, the stack structure 30*i* may pass through the third section T3 of the reflow chamber 400. The third section T3 may be a second high temperature section, and a reflow step may be performed in the third section T3. In the third section T3, the stack structure 30*i* may be heated up to a temperature of 200 degrees Celsius to 250 degrees Celsius to melt the solder patterns 222*b*. Accordingly, while the stack structure 30*i* passes through the third section T3, the solder patterns 222*b* may flow to sufficiently contact the signal bumps 222. As illustrated in FIG. 9, the solder patterns 222*b* may flow from the signal bumps 222 to the signal bump lands 122 to sufficiently form wetting regions on the signal bumps 222 as well as the signal bump lands 122.

Referring to FIG. 9, while the stack structure 30*i* passes through the third section T3, the package substrate 10 and the semiconductor chip 20 may thermally expand due to heat which is provided in the reflow chamber 400. In general, the package substrate 10 may be mainly comprised of a polymer material. Thus, a thermal expansion coefficient of the package substrate 10 may be greater than a thermal expansion coefficient of the semiconductor chip 20 mainly comprised of a silicon material. Accordingly, the package substrate 10 may expand more than the semiconductor chip 20 in lateral directions E1 and E2. As illustrated in FIG. 9, if the package substrate 10 expands, the anchoring bump lands 124 may move in the lateral directions E1 and E2 as compared with the anchoring bump lands 124 illustrated in FIG. 8. As a result of the expansion of the package substrate 10, the anchoring bump lands 124 may sufficiently contact the anchoring bumps 224 and may apply forces F1 and F2 to the anchoring bumps 224 in the lateral directions E1 and E2. Because the anchoring bump lands 124 are in contact with the anchoring bumps 224, the forces F1 and F2 pushing the anchoring bumps 224 in the lateral directions E1 and E2 may be transmitted to the semiconductor chip 20 through the anchoring bumps 224. Because the forces F1 and F2 are applied to the anchoring bumps 224 fixed to a surface of the chip body 210 in the lateral directions E1 and E2, the semiconductor chip 20 may warp due to the forces F1 and F2. That is, the anchoring bumps 224 receiving the forces F1 and F2 may generate a compressive force F210 applied to the semiconductor chip 20 in the z-axis direction. Referring again to FIG. 3, deformation of warpage of the package substrate 10 may more severely occur in the major axis direction. Thus, the force that the anchoring bump lands 124 push the anchoring bumps 224 may generate strongly in the major axis direction.

Referring again to FIG. 7, the stack structure 30i may pass through the fourth section T4. In the fourth section T4, the stack structure 30i may be cooled down from the reflow temperature to a room temperature. Referring again to FIG. 9, while the stack structure 30i passes through the fourth section T4, the solder patterns 222b melted in the third section T3 may be solidified to form solder-bonded portions. The compressive force F210 generated in the third section T3 may be maintained while the stack structure 30i passes through the fourth section T4.

After the stack structure 30i passes through the fourth section T4, the process of binding the signal bumps 222 to the signal bump lands 122 may terminate. That is, after the stack structure 30i is unloaded from the reflow chamber 400, the fabrication of the semiconductor package 30 may be completed, as illustrated in FIG. 10. After the bonding process terminates, the side surfaces of the anchoring bumps 224 may be in contact with respective ones of the side surfaces of the anchoring bump lands 124 to maintain contact states. However, in some other embodiments, the side surfaces of the anchoring bumps 224 may be spaced apart from the side surfaces of the anchoring bump lands 124 after the bonding process terminates.

According to an embodiment described above, there may be provided the semiconductor package 30 including the anchoring bumps 224 and the anchoring bump lands 124 adjacent to the anchoring bumps 224. When the semiconductor chip 20 including the anchoring bumps 224 is bonded to the package substrate 10 including the anchoring bump lands 124, the anchoring bump lands 124 may apply a pushing force to the anchoring bumps 224 due to a difference between the thermal expansion coefficients of the semiconductor chip 20 and the package substrate 10. The pushing force applied to the anchoring bumps 224 may generate a compressive force improving the bondability between the semiconductor chip 20 and the package substrate 10. Thus, the bonding reliability between the semiconductor chip 20 and the package substrate 10 may be improved.

The anchoring bump lands 124 and the anchoring bumps 224 may be used to fix a position of the semiconductor chip 20 while the bonding process is performed to bond the semiconductor chip 20 to the package substrate 10. Referring to FIGS. 7 to 10, in the event that an air convection phenomenon is used to conduct heat to the stack structure 30i in the reflow chamber 400 including the first to fourth sections T1~T4, the air flow in the reflow chamber 400 may apply various directional forces or various directional pressures to the stack structure 30i. In such a case, the air pressure laterally applied to the stack structure 30i may cause the misalignment between the semiconductor chip 20 and the package substrate 10 if the anchoring bump lands 124 and the anchoring bumps 224 are not present. However, according to an embodiment, the anchoring bump lands 124 and the anchoring bumps 224 may act as hooks for preventing or mitigating the semiconductor chip 20 from slipping on the package substrate 10. Thus, the anchoring bump lands 124 and the anchoring bumps 224 may improve the bonding reliability between the semiconductor chip 20 and the package substrate 10.

Figure 11:
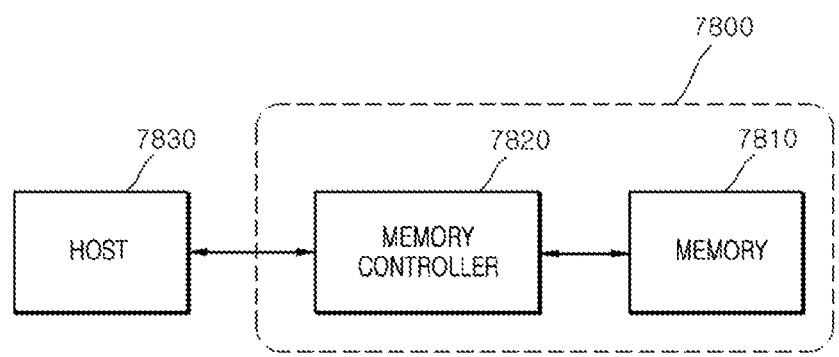
FIG. 11 is a block diagram illustrating an electronic system employing a memory card including a semiconductor package according to an embodiment of the present disclosure.

FIG. 11 is a block diagram illustrating an electronic system including a memory card 7800 employing the semiconductor packages according to an embodiment. The memory card 7800 includes a memory 7810 such as a nonvolatile memory device, and a memory controller 7820. The memory 7810 and the memory controller 7820 may store data or read out the stored data. At least one of the memory 7810 and the memory controller 7820 may include the semiconductor package according to the embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 12:
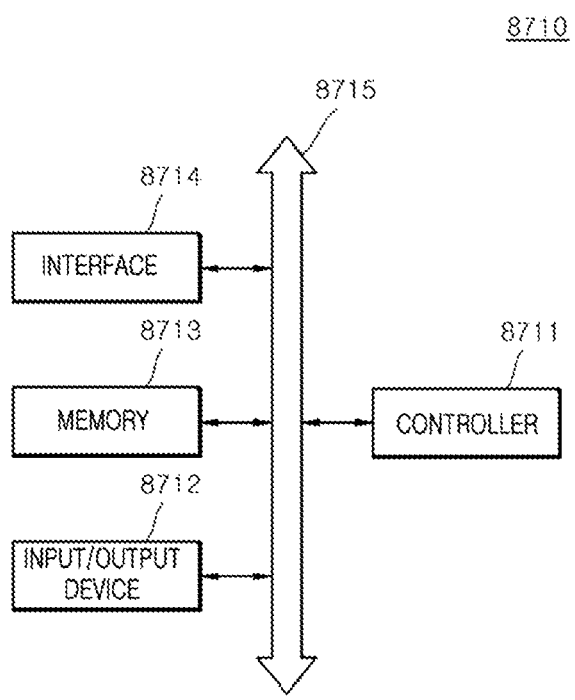
FIG. 12 is a block diagram illustrating another electronic system including a semiconductor package according to an embodiment of the present disclosure.

FIG. 12 is a block diagram illustrating an electronic system 8710 including at least one of the semiconductor packages according to the embodiments. The electronic system 8710 may include a controller 8711, an input/output unit 8712 and a memory 8713. The controller 8711, the input/output unit 8712 and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include the semiconductor packages according to the embodiments of the present disclosure. The input/output unit 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

If the electronic system 8710 is an equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDAM (wideband code division multiple access), CDMA2000, LTE (long term evolution) or Wibro (wireless broadband Internet).

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A semiconductor package comprising:
   a package substrate comprising a signal bump land and an anchoring bump land on a surface of the package substrate; and
   a semiconductor chip mounted on the package substrate and comprising a signal bump and an anchoring bump,
   wherein the signal bump is bonded to the signal bump land,
   wherein the anchoring bump is disposed to be adjacent to the anchoring bump land,
   wherein a bottom surface of the anchoring bump is located at a level which is lower than a top surface of the anchoring bump land with respect to the surface of the package substrate,
   wherein the semiconductor package further comprises a contact portion that a side surface of the anchoring bump is in contact with a side surface of the anchoring bump land,
   wherein the contact portion is disposed on a plane substantially perpendicular to a surface of the semiconductor chip and the surface of the package substrate, and
   wherein the contact portion extends in a direction substantially perpendicular to the surface of the semiconductor chip and the surface of the package substrate,
   wherein a width, a length and a height of the anchoring bump land are respectively substantially equal to a width, a length and a height of the signal bump land on the surface of the package substrate,
   wherein the bottom surface of the anchoring bump has a circular shape with a diameter, and an upper surface of the anchoring bump land has a rectangular shape with the width and the length, and
   wherein the width of the anchoring bump land is greater than the diameter of the anchoring bump.

2. The semiconductor package of claim 1, wherein the anchoring bump is disposed to be laterally offset relative to the anchoring bump land.

3. The semiconductor package of claim 1, wherein the side surface of the anchoring bump overlaps with 40 percent to 70 percent of the height of the side surface of the anchoring bump land.

4. The semiconductor package of claim 1, wherein the anchoring bump has a height which is greater than a height of the signal bump.

5. The semiconductor package of claim 1,
   wherein the signal bump includes a solder pattern that is bonded to the signal bump land.

6. The semiconductor package of claim 1,
   wherein the anchoring bump does not include a solder pattern bonded to the anchoring bump land.

7. The semiconductor package of claim 1,
   wherein the package substrate comprises a substrate body having a surface extending in a major axis direction and a minor axis direction; and
   wherein the anchoring bump land is disposed on a corner region of the surface of the package substrate.

8. The semiconductor package of claim 7,
   wherein the semiconductor chip comprises a chip body having a surface extending in the major axis direction and the minor axis direction;
   wherein the anchoring bump is disposed on the chip body of the semiconductor chip and the anchoring bump is located closer to an edge region of the surface of the chip body than the anchoring bump land in the major axis direction, and
   wherein the anchoring bump is located closer to an edge region of the surface of the substrate body than the anchoring bump land in the major axis direction.

9. The semiconductor package of claim 7,
   wherein the anchoring bump land has the width in the minor axis direction and the length in the major axis direction; and
   wherein the width is greater than the length.

10. The semiconductor package of claim 7,
    wherein the package substrate further comprises a solder resist layer that is disposed on the substrate body to selectively expose the signal bump land and the anchoring bump land; and
    wherein the anchoring bump is disposed to be inserted into an empty space between the anchoring bump land and the solder resist layer.

11. The semiconductor package of claim 10, wherein the empty space in which the anchoring bump is disposed is located over a region of the surface of the substrate body, which is exposed by an opening of the solder resist layer.

12. The semiconductor package of claim 7, wherein a thermal expansion coefficient of the package substrate is greater than a thermal expansion coefficient of the semiconductor chip.

13. The semiconductor package of claim 12, wherein when the package substrate and the semiconductor chip thermally expand while the semiconductor chip is stacked on the package substrate, the anchoring bump land is disposed to apply a pushing force to the anchoring bump in the major axis direction.

14. A semiconductor package comprising:
    a package substrate configured to include a surface extending in a major axis direction and a minor axis direction and configured to include a signal bump land and an anchoring bump land disposed on the surface of the package substrate; and
    a semiconductor chip mounted on the package substrate and comprising a signal bump adjacent the signal bump land and an anchoring bump adjacent the anchoring bump land,
    wherein the anchoring bump land is disposed on a corner region of the surface of the package substrate, and wherein the anchoring bump is disposed to be closer to an edge region of the surface of the package substrate than the anchoring bump land in the major axis direction, wherein the semiconductor package further comprises a contact portion that a side surface of the anchoring bump is in contact with a side surface of the anchoring bump land, wherein the contact portion is disposed on a plane substantially perpendicular to a surface of the semiconductor chip and the surface of the package substrate, and wherein the contact portion extends in a direction substantially perpendicular to the surface of the semiconductor chip and the surface of the package substrate, wherein a width, a length and a height of the anchoring bump land are respectively substantially equal to a width, a length and a height of the signal bump land on the surface of the package substrate, wherein a bottom surface of the anchoring bump has a circular shape with a diameter, and an upper surface of the anchoring bump land has a rectangular shape with the width and the length, wherein the width of the anchoring bump land is greater than the diameter of the anchoring bump.

15. The semiconductor package of claim 14, wherein the signal bump is disposed to be bonded to the signal bump land; and wherein a portion of the side surface of the anchoring bump overlaps with at least a portion of the side surface of the anchoring bump land.

16. The semiconductor package of claim 15, wherein the side surface of the anchoring bump overlaps with 40 percent to 70 percent of the height of the side surface of the anchoring bump land.

17. The semiconductor package of claim 15, wherein a thermal expansion coefficient of the package substrate is greater than a thermal expansion coefficient of the semiconductor chip; and wherein when the package substrate and the semiconductor chip thermally expand while the semiconductor chip is stacked on the package substrate, the anchoring bump land is disposed to apply a pushing force to the anchoring bump in the major axis direction.

18. The semiconductor package of claim 14, wherein the bottom surface of the anchoring bump is located above the surface of the package substrate without contacting the package substrate.

19. The semiconductor package of claim 14, wherein the bottom surface of the anchoring bump is in contact with the surface of the package substrate.

20. The semiconductor package of claim 14, wherein the anchoring bump has a height which is greater than a height of the signal bump.

21. The semiconductor package of claim 14, wherein the signal bump comprises a solder pattern bonded to the signal bump land; and wherein the anchoring bump does not include a solder pattern bonded to the anchoring bump land.

22. The semiconductor package of claim 14, wherein the anchoring bump land has the width in the minor axis direction and the length in the major axis direction; and wherein the width is greater than the length.

23. The semiconductor package of claim 14, wherein the package substrate further comprises a solder resist layer that is disposed on the surface of the package substrate to selectively expose the signal bump land and the anchoring bump land; and wherein the anchoring bump is disposed to be inserted into an empty space between the anchoring bump land and the solder resist layer.

24. The semiconductor package of claim 23, wherein the empty space in which the anchoring bump is disposed is located over a region of the surface of the package substrate, which is exposed by an opening of the solder resist layer.

* * * * *